US012643147B2

(12) United States Patent
Yamauchi et al.

(10) Patent No.: US 12,643,147 B2
(45) Date of Patent: Jun. 2, 2026

(54) JOINT STRUCTURE

(71) Applicant: MITSUI KINZOKU COMPANY, LIMITED, Tokyo (JP)

(72) Inventors: Shinichi Yamauchi, Ageo (JP); Kei Anai, Ageo (JP)

(73) Assignee: MITSUI KINZOKU COMPANY, LIMITED (JP)

( * ) Notice: Subject to any disclaimer, the term of this patent is extended or adjusted under 35 U.S.C. 154(b) by 291 days.

(21) Appl. No.: 18/279,012

(22) PCT Filed: Mar. 28, 2022

(86) PCT No.: PCT/JP2022/014835
§ 371 (c)(1),
(2) Date: Aug. 25, 2023

(87) PCT Pub. No.: WO2022/210477
PCT Pub. Date: Oct. 6, 2022

(65) Prior Publication Data

US 2024/0149340 A1 May 9, 2024

(30) Foreign Application Priority Data

Mar. 30, 2021 (JP) ................................ 2021-058724

(51) Int. Cl.
*B22F 7/06* (2006.01)
*B22F 1/052* (2022.01)
(Continued)

(52) U.S. Cl.
CPC .............. *B22F 7/064* (2013.01); *B22F 1/052* (2022.01); *B22F 1/056* (2022.01); *B22F 1/068* (2022.01);
(Continued)

(58) Field of Classification Search
None
See application file for complete search history.

(56) References Cited

U.S. PATENT DOCUMENTS

2009/0264028 A1 10/2009 Chuma
2018/0265744 A1* 9/2018 Sugo ....................... H01L 24/83
(Continued)

FOREIGN PATENT DOCUMENTS

EP 3358605 A1 8/2018
JP 2014-29897 A 2/2014
(Continued)

OTHER PUBLICATIONS

Uenoyama—JP 2016-015256 A—MT—conductive particles+ bonded structure—2016 (Year: 2016).*
(Continued)

*Primary Examiner* — John Vincent Lawler
(74) *Attorney, Agent, or Firm* — Harness, Dickey & Pierce, P.L.C.

(57) ABSTRACT

A bonded structure is a structure in which two bonding target members and a bonding portion formed between and adjacent to the bonding target members are bonded together. The bonding portion is made of a material mainly containing copper. In a cross section of the bonded structure taken along a thickness direction, a ratio of a bonded rate between the bonding target members and the bonding portion in a peripheral region of the bonded structure to a bonded rate between the bonding target members and the bonding portion in a central region of the bonded structure is from 0.6 to 0.9. The bonded rate is 0.3 or more.

9 Claims, 3 Drawing Sheets

(51) Int. Cl.

| | |
|---|---|
| ***B22F 1/054*** | (2022.01) |
| ***B22F 1/068*** | (2022.01) |
| ***B22F 1/107*** | (2022.01) |
| ***B22F 3/14*** | (2006.01) |
| ***B22F 7/08*** | (2006.01) |
| ***B32B 7/12*** | (2006.01) |
| ***B32B 9/04*** | (2006.01) |
| ***B32B 15/20*** | (2006.01) |
| ***H10W 72/00*** | (2026.01) |
| ***H10W 72/30*** | (2026.01) |
| ***H10W 72/90*** | (2026.01) |
| ***H10W 90/00*** | (2026.01) |

(52) U.S. Cl.

CPC ................ *B22F 1/107* (2022.01); *B22F 3/14* (2013.01); *B22F 7/08* (2013.01); *B32B 7/12* (2013.01); *B32B 9/041* (2013.01); *B32B 15/20* (2013.01); *B22F 2201/02* (2013.01); *B22F 2301/10* (2013.01); *B22F 2304/056* (2013.01); *B22F 2304/10* (2013.01); *B22F 2998/10* (2013.01); *B22F 2999/00* (2013.01); *B32B 2250/02* (2013.01); *B32B 2255/06* (2013.01); *B32B 2255/205* (2013.01); *B32B 2255/26* (2013.01); *B32B 2307/748* (2013.01); *H10W 72/07331* (2026.01); *H10W 72/352* (2026.01); *H10W 72/952* (2026.01); *H10W 90/731* (2026.01)

(56) References Cited

U.S. PATENT DOCUMENTS

| | | | | |
|---|---|---|---|---|
| 2020/0108471 | A1 * | 4/2020 | Ishikawa | B23K 35/025 |
| 2021/0138541 | A1 | 5/2021 | Anai et al. | |
| 2022/0118546 | A1 | 4/2022 | Anai et al. | |

FOREIGN PATENT DOCUMENTS

| | | | | | |
|---|---|---|---|---|---|
| JP | 2016015256 | A | * | 1/2016 | H01B 1/00 |
| JP | 2020-38896 | A | | 3/2020 | |
| JP | 2020038896 | A | * | 3/2020 | H01L 21/52 |
| JP | 2004362950 | A | * | 12/2024 | B22F 1/00 |
| WO | 2008/032386 | A1 | | 3/2008 | |
| WO | WO-2020032161 | A1 | * | 2/2020 | B22F 1/145 |
| WO | 2020/203530 | A1 | | 10/2020 | |

OTHER PUBLICATIONS

Sato—JP 2020-038896 A—PCT D1 + Euro D2+CN D1—MT—junction structure—2020 (Year: 2020).*

Anai—WO 2020-032161 A1—PCT D2 + Euro D4 + CN D2—MT—bonding structure—Feb. 2020 (Year: 2020).*

Nagai—JP 2004-362950 A—MT—rel.amt. sphere & flake silver particles—2004 (Year: 2004).*

International Search Report (English and Japanese) issued in PCT/JP2022/014835, mailed Jun. 14, 2022; ISA/JP (5 pages).

* cited by examiner

JOINT STRUCTURE

CROSS REFERENCE TO RELATED APPLICATIONS

This application is a 371 U.S. National Phase of International Application No. PCT/JP2022/014835, filed on Mar. 28, 2022, which claims priority to Japanese Patent Application No. 2021-058724, filed Mar. 30, 2021. The entire disclosures of the above applications are incorporated herein by reference.

TECHNICAL FIELD

Background

The present invention relates to a bonded structure.

Related Art

With the recent global trend for energy efficiency and conservation, semiconductor devices called power devices have been widely used as power conversion/control devices such as inverters. As a technique applicable to such devices, the applicant of the present invention has proposed a bonded structure in which two bonding target members are connected by a bonding portion containing copper and having a predetermined chemical structure (see WO 2020/032161).

Although the bonded structure described in WO 2020/032161 is capable of realizing high bonding strength, for example, when semiconductor devices equipped with such a bonded structure are used for automotive applications or the like, high bonding strength is required to be maintained even when the devices are placed in an environment with severe temperature changes over a long period of time, that is, high bonding reliability is increasingly required.

It is an object of the present invention to provide a bonded structure with high bonding reliability.

SUMMARY

The present invention is directed to a bonded structure in which two bonding target members and a bonding portion formed between and adjacent to the bonding target members are bonded together, wherein the bonding portion is made of a material mainly containing copper, a ratio (Rs/Rc) of a bonded rate Rs between the bonding target members and the bonding portion in a peripheral region of the bonded structure to a bonded rate Rc between the bonding target members and the bonding portion in a central region of the bonded structure is from 0.6 to 0.9, in a cross section of the bonded structure taken along a thickness direction thereof, and the bonded rate Rc is 0.3 or more.

Figure 1A:
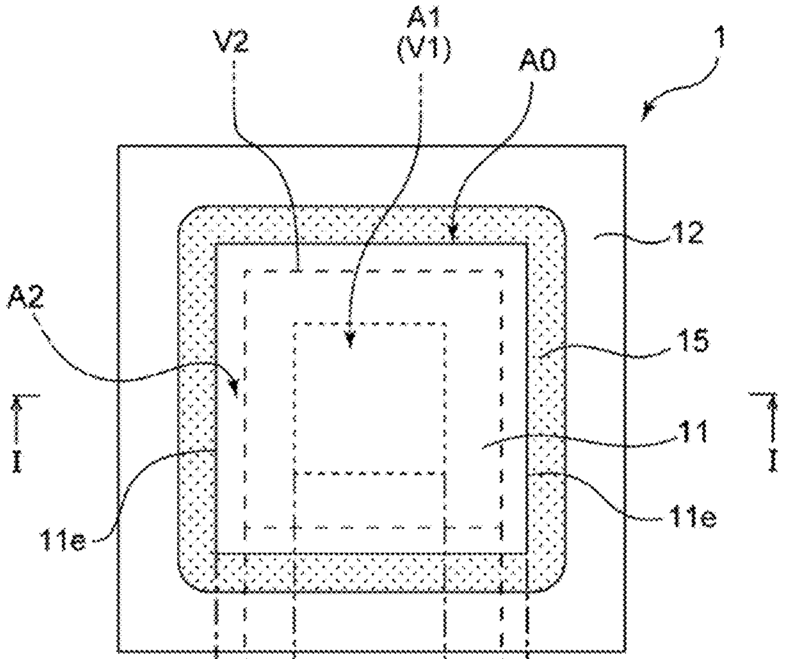
FIG. 1(*a*) is a schematic plan view of a bonded structure according to an embodiment of the present invention, and FIG. 1(*b*) is a schematic cross-sectional view taken along the line I-I in FIG. 1(*a*).
Figure 1B:
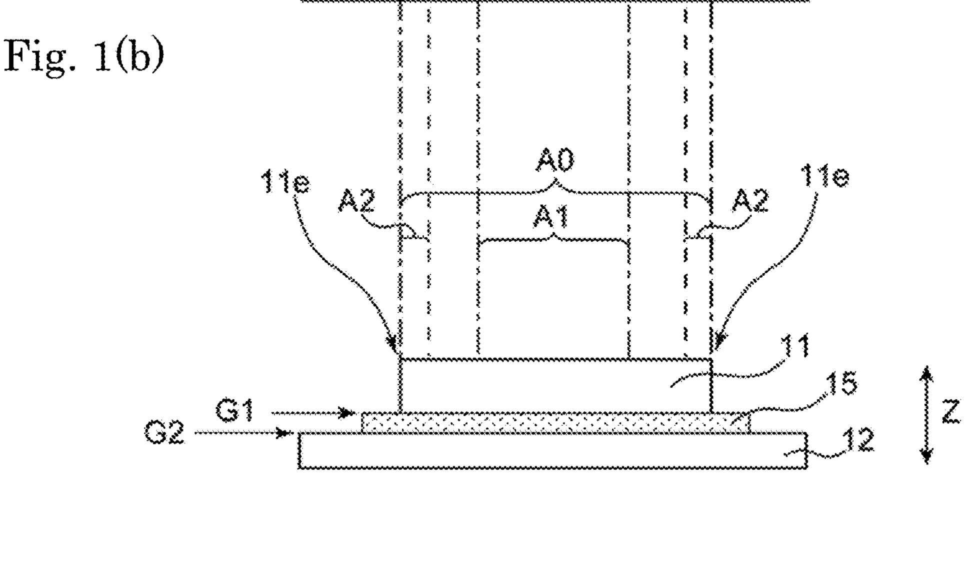

2(*b*) is an enlarged view schematically showing a panoramic image of a boundary plane between the bonding target member 11 and the bonding portion 15 in a peripheral region A2, in a cross section of the bonded structure 1 shown in FIG. 1(*a*) taken along the thickness direction.

Figure 3A:
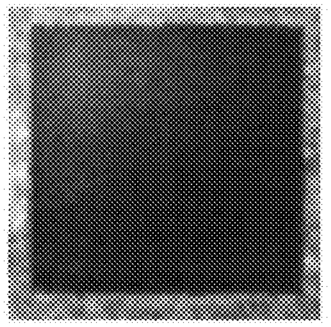
Figure 3B:
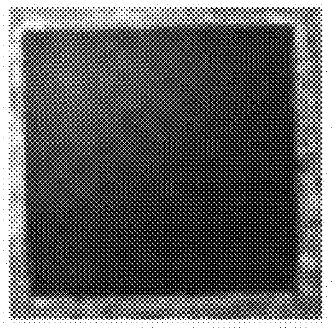

FIG. 3(*a*) is an ultrasonic image of the bonded structure 1 of Example 1 before a temperature cycle test, and FIG. 3(*b*) is an ultrasonic image of the bonded structure 1 of Example 1 after the temperature cycle test.

Figure 4A:
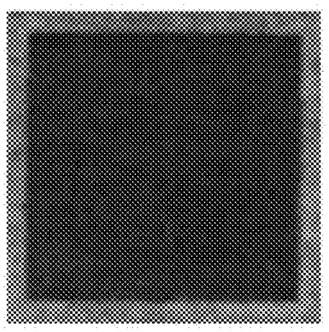
Figure 4B:
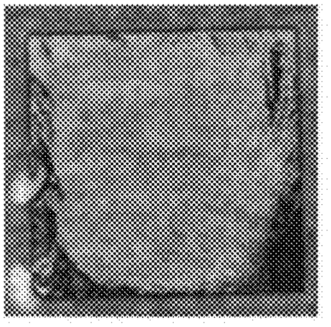

FIG. 4(*a*) is an ultrasonic image of the bonded structure 1 of Comparative Example 1 before a temperature cycle test, and FIG. 4(*b*) is an ultrasonic image of the bonded structure 1 of Comparative Example 1 after the temperature cycle test.

DETAILED DESCRIPTION

Hereinafter, a bonded structure according to the present invention will be described based on a preferred embodiment thereof.

FIGS. 1(*a*) and 1(*b*) show a bonded structure according to an embodiment of the present invention. In the embodiment shown in these drawings, a bonded structure 1 includes a first bonding target member 11 (hereinafter alternatively referred to simply as a “bonding target member 11”) and a second bonding target member 12 (hereinafter alternatively referred to simply as a “bonding target member 12”), and further includes a bonding portion 15 formed between and adjacent to the bonding target members 11 and 12. The bonding target members 11 and 12 in the bonded structure 1 are bonded to each other via the bonding portion 15, and no other members are interposed between the bonding target members 11 and 12 and the bonding portion 15. In the bonded structure 1 according to the embodiment shown in these drawings, the bonding portion 15 and the first bonding target member 11 are stacked in this order on one face of the second bonding target member 12.

The bonding target member 11 shown in FIGS. 1(*a*) and 1(*b*) has smaller dimensions than those of the bonding target member 12, but there is no limitation to this, and the bonding target members 11 and 12 may have the same dimensions or the bonding target member 11 may be larger than the bonding target member 12. Furthermore, although all the bonding target members 11 and 12 and the bonding portion 15 shown in these drawings have flat faces, but may have curved faces as necessary.

Furthermore, the bonding portion 15 shown in FIGS. 1(*a*) and 1(*b*) has a peripheral edge extending outward from that of the bonding target member 11, but there is no limitation to this, and the peripheral edge of the bonding portion 15 and the peripheral edge of the bonding target member 11 may be aligned with each other.

There is no particular limitation on the type of bonding target members 11 and 12, but preferably at least one of the bonding target members 11 and 12, and more preferably both of the bonding target members 11 and 12 contain metal on a face that comes into contact with the bonding portion 15. In this case, it is also preferable that the bonding target members 11 and 12 are electrically connected to each other via the bonding portion 15. That is to say, the bonding target members 11 and 12 are independent of each other, and are preferably conductors. The metals forming the surfaces of the bonding target members 11 and 12 are preferably each independently at least one of gold, silver, copper, nickel, and titanium, from the viewpoint of improving the conductivity.

The bonding target members 11 and 12 containing such a metal are each independently a spacer and a heat sink made of the above-listed metals, a semiconductor device, or a substrate having at least one of the above-listed metals on the surface thereof, for example. As the substrate, for example, an insulating substrate having a metal layer made of copper or the like on the surface of a ceramic or aluminum nitride plate can be used. If a semiconductor device is used as a bonding target member, the semiconductor device contains one or more of elements such as Si, Ga, Ge, C, N, and As. The metals that are on the surfaces of the bonding target members 11 and 12 may be a single metal or an alloy of two or more metals.

The bonding target member 11 is preferably one of a spacer, a heat sink, and a semiconductor device. The bonding target member 12 is preferably a substrate.

The bonding portion 15 is a structure mainly containing copper, and is interposed between and adjacent to the bonding target members 11 and 12 preferably over the entire region between the bonding target members in plan view. The bonding portion 15 contains copper in an amount of preferably 50 mass % or more, and more preferably 60 mass % or more. The content of copper in the bonding portion can be measured by analyzing a cross section of the bonded structure 1 taken along the thickness direction, using energy dispersive X-ray spectroscopy (EDX).

This bonding portion 15 can be formed as a sintered body of metal particles by firing a composition containing metal particles containing copper together with the two bonding target members as shown in the manufacturing method described below, for example. The bonding portion 15 formed as a sintered body containing these particles may have a large number of voids in its structure.

The bonded structure according to the present invention is characterized in that, in a cross section thereof taken along the thickness direction, the bonded rate between the bonding target members and the bonding portion in a central region of the bonded structure is different from that in a peripheral region thereof.

Specifically, as shown in FIG. 1(*a*), when the center of a maximum region A0 in plan view in which the bonding target members 11 and 12 and the bonding portion 15 of the bonded structure 1 are bonded together is set in conformity with the center of a similar figure in plan view obtained by reducing the plane area of the maximum region A0 to 50%, a virtual region V1 represented by the shape of the similar figure in plan view is taken as a central region A1 of the bonded structure 1. In a cross section of the central region A1 of the bonded structure 1 taken along a thickness direction Z, the bonded rate at the boundary plane between at least one of the bonding target members 11 and 12 and the bonding portion 15 located in the central region A1 is taken as a first bonded rate Rc (hereinafter alternatively referred to simply as a "bonded rate Rc").

Note that the maximum region A0 is the maximum region in which both bonding target members 11 and 12 and the bonding portion 15 are all present when the bonded structure 1 is viewed in the thickness direction Z. Accordingly, in the bonded structure 1 shown in FIGS. 1(*a*) and 1(*b*) as an example, the maximum region A0 conforms to the region in which the bonding target member 11 is disposed in plan view.

Furthermore, as shown in FIG. 1(*a*), in plan view of the bonded structure 1, when the center of the maximum region A0 in plan view is set in conformity with the center of a similar figure in plan view obtained by reducing the plane area of the maximum region A0 to 90%, a virtual region V2 represented by the shape of the similar figure in plan view is considered. At this time, the region that is located outside the virtual region V2 and inside the peripheral edge of the maximum region A0 (corresponding to a peripheral edge 11*e* of the bonding target member 11 in the drawings) in plan view of the bonded structure 1 is taken as a peripheral region A2 of the bonded structure 1. In a cross section of the peripheral region A2 of the bonded structure 1 taken along the thickness direction Z, the bonded rate at the boundary plane between at least one of the bonding target members 11 and 12 and the bonding portion 15 located in the peripheral region A2 is taken as a second bonded rate Rs (hereinafter alternatively referred to simply as a "bonded rate Rs"). The boundary plane on which the bonded rate Rs is obtained is the same as the boundary plane on which the bonded rate Rc is obtained.

At this time, a ratio (Rs/Rc) of the bonded rate Rs to the bonded rate Rc is preferably 0.6 or more, and more preferably 0.7 or more. Furthermore, the Rs/Rc is preferably 0.9 or less, and more preferably 0.8 or less. That is to say, the bonded structure 1 has a higher bonded rate in the central region A1 than in the peripheral region A2, on a boundary plane between at least one of the bonding target members and the bonding portion.

The inventors of the present invention presume as follows as to why the bonded structure can realize high bonding reliability if the Rs/Rc is within the above-mentioned range. The reference numerals shown in FIG. 1 will be used as an example in the description below.

The bonded structure 1 in which the bonding portion 15 is formed between the two bonding target members 11 and 12 is typically manufactured by preparing a conductive composition having flowability as the material for forming the bonding portion 15 and firing the composition disposed between the two bonding target members 11 and 12 with application of pressure and at a high temperature increase rate. At this time, since the composition remains flowable in the initial stage of firing, the applied pressure pushes the composition to the outside of the peripheral edges of the bonding target members 11 and 12 and moves the composition to increase the density of the composition in the central region A1 of the bonding target members 11 and 12 in plan view. When sintering is performed in this state, the composition is sintered efficiently while the structure is relatively dense in the central region A1 in plan view, and the bonding portion 15 that realizes sufficient adhesiveness with the bonding target members 11 and 12 is formed between the bonding target members 11 and 12 over the entire region between the bonding target members 11 and 12 in plan view. In particular, if the Rs/Rc is within the above-mentioned specific range, the bonding strength of the bonded structure 1 as a whole is maintained, and the stress concentration on the peripheral region A2 of the bonded structure 1 is alleviated, and thus the bonding function of the bonding portion can be kept high even in an environment with temperature changes, and the high bonding reliability can be maintained.

On the other hand, if the bonding portion 15 is formed under the conditions that the pressure applied is insufficient or the temperature increase rate is not proper, the bonding portion 15 located in the central region A1 of the bonded structure 1 in plan view is unlikely to have a dense structure, and Rs/Rc is close to 1. In this case, the stress concentration on the peripheral region A2 of the bonding portion 15 cannot be alleviated, and thus the bonding reliability is unlikely to be maintained.

The bonded rate Rc is preferably 0.3 or more, more preferably 0.4 or more, and even more preferably 0.5 or more. The higher the bonded rate, the better, in order to realize sufficient bonding strength with the bonding target members.

The bonded rate Rs is preferably from 0.35 to 0.6, more preferably from 0.35 to 0.55, and even more preferably from 0.35 to 0.5. If the bonded rate Rs is within this range, the modulus of elasticity of the peripheral region A2 of the bonded member becomes moderately low, which prevents cracking due to stress concentration on the peripheral region A2.

The Rs/Rc, the first bonded rate Rc, and the second bonded rate Rs described above are to define the relationship between at least one of the bonding target members 11 and 12 and the bonding portion 15 on at least one of the boundary planes. The above-described ratio and bonded rates satisfy the above-mentioned suitable ranges preferably at least on a boundary plane G1 between the bonding target member 11 and the bonding portion 15, and more preferably further on a boundary plane G2 between the bonding target member 12 and the bonding portion 15 as well as on the boundary plane G1.

This bonded structure 1 can be obtained by firing a conductive composition containing metal particles containing copper together with the two bonding target members 11 and 12 with application of predetermined pressure and at a predetermined temperature increase rate, as shown in the manufacturing method described below, for example.

The first bonded rate Rc and the second bonded rate Rs can be measured using the following method.

First, after the bonded structure 1 to be measured is embedded in resin, the maximum region A0, the central region A1, and the peripheral region A2 are each defined in the plan view of the bonded structure 1 through optical microscope observation. Then, the bonded structure embedded in resin is cut in the thickness direction at a position through the center of the maximum region A0 in plan view (corresponding to the center of the first bonding target member 11 in plan view in FIG. 1(*a*)), the cut face is polished, and the polished face is further processed through ion milling to manufacture an observation face corresponding to a cross section taken along a thickness direction extending through the center of the figure as shown in FIG. 1(*b*), for example.

Next, the position of the boundary plane G1 or the boundary plane G2 to be measured between the bonding target member and the bonding portion is specified through visual observation using an electron microscope at a freely chosen position in the central region A1 on the above-described observation face.

Next, a panoramic image is obtained by taking a plurality of images at a magnification that makes the object clear and arranging them side by side such that a total length Lt in the measurement field of view is about 30 μm in electron microscopic observation, for example. In this state, one of the boundary planes G1 and G2 between the bonding target members 11 and 12 and the bonding portion 15 is measured, and the total of lengths La along a plane direction X of regions in which the boundary plane is unclear is obtained and taken as a bonded length L1 in the central region A1. Alternatively, the bonded length L1 may be calculated by subtracting the total of lengths of regions in which the boundary plane G1 or G2 to be measured between the bonding target member 11 or 12 and the bonding portion 15 is clear from the total length Lt in the measurement field of view. The bonded length L1 can be calculated visually or by using software as necessary, from the electron microscope image described above or a binarized image described below.

Figure 2A:
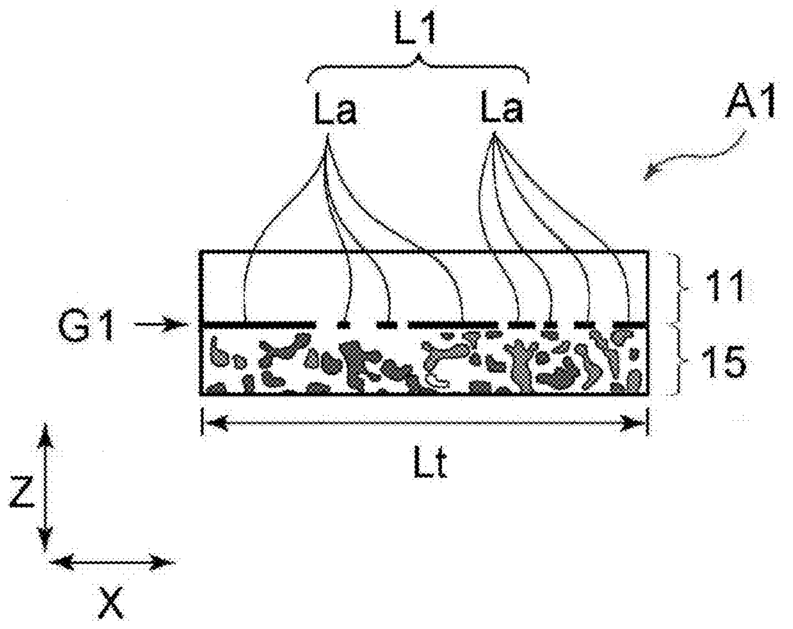
FIG. 2(*a*) is an enlarged view schematically showing a panoramic image of a boundary plane between a bonding target member 11 and a bonding portion 15 in a central region A1, in a cross section of a bonded structure 1 shown in FIG. 1(*a*) taken along the thickness direction, and FIG.
Figure 2B:
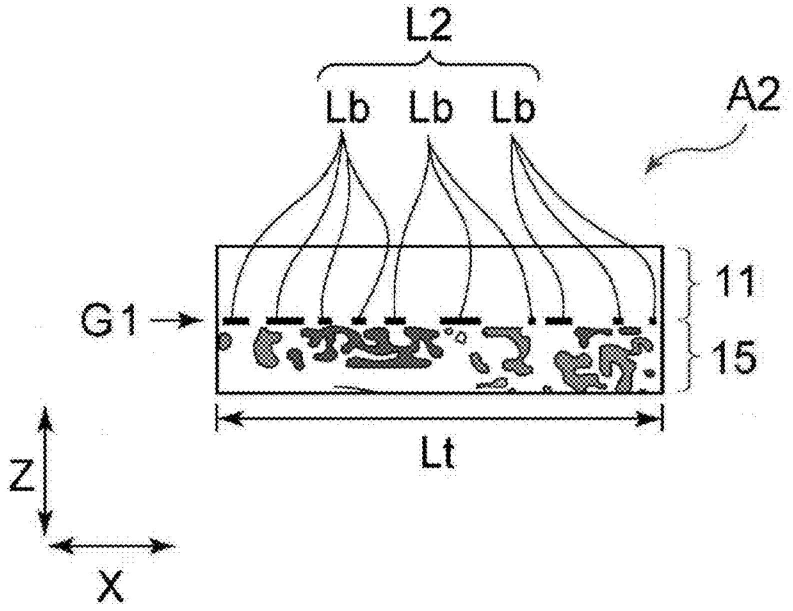

FIG. 2(*a*) shows a schematic view of a panoramic image in the central region A1, using the boundary plane G1 between the first bonding target member 11 and the bonding portion 15 as an example. This schematic view also shows the total length Lt, the lengths La, and the bonded length L1.

The ratio (L1/Lt) of the bonded length L1 in the central region to the total length Lt in the measurement field of view is taken as a first bonded rate Rc in the present invention.

In a similar manner, the same boundary plane as that subjected to the measurement of the bonded rate Rc is specified through visual observation using an electron microscope out of the boundary planes G1 and G2 between the bonding target members 11 and 12 and the bonding portion 15, at a freely chosen position in the peripheral region A2 on the above-described observation face.

In measurement in the peripheral region A2 as well, a panoramic image is obtained such that the total length Lt in the measurement field of view is about 30 μm in a similar way to that of the above-described method in electron microscopic observation, for example. In this state, the total of lengths Lb along the plane direction X of regions in which the boundary plane to be measured between the bonding target member 11 or 12 and the bonding portion 15 is unclear is measured and taken as a bonded length L2 in the peripheral region A2. Alternatively, the bonded length L2 may be calculated by subtracting the total of lengths of regions in which the boundary plane between the bonding target member 11 or 12 and the bonding portion 15 is clear, from the total length Lt in the measurement field of view. The bonded length L2 can be calculated visually or by using software as necessary, from the electron microscope image described above or a binarized image described below.

FIG. 2(*b*) shows a schematic view of a panoramic image in the peripheral region A2, using the boundary plane G1 between the first bonding target member 11 and the bonding portion 15 as an example. This schematic view also shows the total length Lt, the lengths Lb, and the bonded length L2.

The ratio (L2/Lt) of the bonded length L2 in the peripheral region A2 to the total length Lt in the measurement field of view is taken as a bonded rate Rs in the present invention.

The above-mentioned "regions in which the boundary plane G1 or G2 between the bonding target member 11 or 12 and the bonding portion 15 is unclear" mean regions in which the metal particles and the bonding target member have been sufficiently sintered at the time of manufacture of the bonded structure 1. Meanwhile, the "regions in which the boundary plane G1 or G2 between the bonding target member 11 or 12 and the bonding portion 15 is clear" mean regions in which the metal particles and the bonding target member have not been sintered at the time of manufacture of the bonded structure 1.

Whether or not the boundary plane G1 between the bonding target member 11 and the bonding portion 15 is clear is determined as follows. That is to say, if the boundary between a region represented by a color and a region represented by another color is observed in a binarized image obtained by binarizing an electron microscopic image of the boundary plane G1 to be measured between the bonding target member 11 and the bonding portion 15 taken along the thickness direction, it is determined that the boundary plane G1 between the bonding target member 11 and the bonding portion 15 is clear. On the other hand, if such a boundary is not observed, it is determined that the boundary plane G1 between the bonding target member 11 and the bonding portion 15 is unclear.

It is also possible to determine whether the boundary plane G2 between the bonding target member 12 and the bonding portion 15 is clear or unclear, by observing the boundary plane G2 in a similar way to that of the above-described method.

For the sake of ease of description, the method for measuring the bonded rates Rc and Rs was explained based on one cross section taken along the thickness direction of the bonded structure 1. Typically, each of the bonding target members 11 and 12 and the bonding portion 15 in the bonded structure 1 are continuously bonded over the entire maximum region A0 in plan view. Accordingly, in the bonded structure 1, a virtual circle that is centered on the center of the maximum region A0 in plan view and virtual radial lines that extend through the center of the virtual circle and cut the virtual circle at 30° intervals are preferably such that all of the bonded rates Rc and Rs measured through observation of cross sections obtained by cutting the bonded structure in plan view along the virtual radial lines at 30° intervals in the thickness direction are within the above-mentioned ranges.

Next, a method for manufacturing the bonded structure will be described. This manufacturing method is roughly divided into three steps consisting of an applying step of applying a copper-containing bonding composition to a surface of one of the bonding target members (e.g., the bonding target member 12) to form a coating film, a drying step of drying the coating film to form a dry coating film, and a bonding step of further stacking the other bonding target member (e.g., the bonding target member 11) on the dry coating film and bonding them by applying pressure and heat in this state.

First, a copper-containing bonding composition is applied to a surface of one of the bonding target members to form a coating film (applying step). The bonding composition preferably contains metal particles containing copper and a liquid medium. Details of the bonding composition will be described later.

The method for applying the bonding composition is preferably a method that allows the coating film to be formed at a uniform thickness and to be applied to the entire area of the surface to be coated. Examples of such an application method include screen printing, dispensing printing, gravure printing, and offset printing. From the viewpoint of improving uniformity of application, it is preferable to use a bonding composition in the form of paste or ink containing a liquid medium.

From the viewpoint of forming a bonded structure with high and stable bonding strength, the coating film is formed to have a thickness of preferably 1 to 250 μm and more preferably 5 to 150 μm immediately after application. Furthermore, from the viewpoint of facilitating the formation of a bonding portion over the entire bonding faces between the bonding target members and the bonding member, without portions in which the bonding target members and the bonding member are adjacent to each other but do not adhere to each other, thereby increasing the bonding strength with the bonding targets over the entire bonding faces, the coating film is applied preferably in an area in plan view that is larger than or equal to the bottom area of a bonding target member subjected to be bonding and having the smallest plane area.

Next, the formed coating film is dried to obtain a dry coating film (drying step). In this step, at least part of the liquid medium is removed from the coating film through drying to obtain a dry coating film with a reduced amount of liquid medium in the coating film. If the liquid medium is removed from the coating film, the shape retention of the dry coating film can be improved, and, since the bonding target members are bonded together in that state, the bonding strength can be increased. The dry coating film is a film in which the ratio of the liquid medium to the total mass of the film is 9 mass % or less. Since the coating film and the dry coating film obtained by drying the coating film contain substantially the same amount of each constituent material other than the liquid medium, the proportion of the liquid medium in the dry coating film can be calculated by measuring the change in mass of the coating film before and after drying, for example.

To dry and remove the liquid medium, a method to volatilize the liquid medium using its volatility can be employed. Examples thereof include natural drying, hot air drying, infrared irradiation, hot plate drying, and other drying methods.

The proportion of the liquid medium in the dry coating film after the liquid medium is removed is preferably 9 parts by mass or less with respect to 100 parts by mass of the total mass of the coating film as described above. The proportion is more preferably 7 parts by mass or less, and even more preferably 5 parts by mass or less.

Although this step can be modified as appropriate according to the composition of the bonding composition to be used, it is preferable to perform the step under an atmospheric atmosphere at 40 to 150° C. for 1 to 60 minutes, in order to prevent deterioration of the bonding composition and the bonding target members to be dried together and to increase the bonding strength between the bonding target members while maintaining the desired material properties of the bonding target member.

Subsequently, the other bonding target member is stacked on and bonded to the dry coating film (bonding step). Specifically, when the dry coating film is obtained through the above-described steps, the other bonding target member is stacked on the dry coating film to obtain a stack in which a first bonding target member and a second bonding target member are arranged with the dry coating film interposed therebetween. This stack is a structure in which the coating film and the first bonding target member are stacked in this order on one of the faces of the second bonding target member, for example.

Then, the stack is heated at a predetermined temperature increase rate with application of pressure to sinter the metal powder contained in the dry coating film, thereby forming a bonding portion that bonds the two bonding target members.

The atmosphere during sintering is preferably a reducing gas atmosphere such as hydrogen or formic acid, or an inert gas atmosphere such as nitrogen or argon.

The sintering temperature is preferably 150 to 350° C., more preferably 200 to 350° C., and even more preferably 230 to 300° C.

The temperature increase rate during sintering is preferably from 120 to 2000° C./min, more preferably from 240 to 1500° C./min, and even more preferably from 360 to 1000° C./min, during the period in which the temperature increases from 40° C. to reach the above-mentioned sintering temperature. This temperature increase rate is faster than the temperature increase rate conventionally employed in the manufacture of bonded structures. If this rate is employed, a bonded structure that satisfies the above-mentioned relationship of Rs/Rc can be manufactured in a short time.

The pressure applied during sintering is kept preferably more than 6 MPa and 40 MPa or less, more preferably from 8 to 30 MPa, and even more preferably from 10 to 20 MPa, from the start of heating to the end of sintering.

The sintering time is preferably from 0.5 to 120 minutes, more preferably from 1 to 60 minutes, and even more preferably from 1 to 30 minutes, provided that the sintering temperature is within the above-mentioned range.

The bonded structure 1 in which the bonding portion 15 formed as a sintered body of metal particles containing copper and constituting the bonding composition is formed between the two bonding target members 11 and 12 is obtained through the above-described steps. According to the suitable manufacturing method described above, the bonded structure 1 in which the above-mentioned relationship of Rs/Rc is satisfied both between the first bonding target member 11 and the bonding portion 15 and between the second bonding target member 12 and the bonding portion 15 can be suitably obtained. The bonding portion 15 contains copper, and, if the bonding composition contains the solid reducing agent described below, Structure (1) below is formed in the bonding layer.

(1)

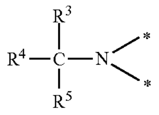

In Formula (1), $R^3$ to $R^5$ are each independently represent a hydrogen atom, a hydroxyl group, a hydrocarbon group having 1 to 10 carbon atoms, or a hydrocarbon group having 1 to 10 carbon atoms and having a hydroxyl group. The description of Chemical Formulas (2) and (3) below applies as appropriate to the details of $R^3$ to $R^5$. Furthermore, * represents a copper-binding site.

Whether or not Structure (1) above is formed in the bonding layer can be seen by performing mass spectrometry analysis using TOF-SIMS or the like on a cross section of the bonding portion. For example, if BIS-TRIS is used as the reducing agent, an m/z152 fragment attributed to "C—N $(Cu)_2$" is observed in the mass spectrum on the cathode side in TOF-SIMS.

The bonding composition contains a metal powder constituted by metal particles containing copper, and preferably further contains a reducing agent and a liquid medium.

The metal powder used in the present invention is preferably constituted by an assemblage of metal particles containing copper. The metal powder may further contain at least one metal selected from gold, silver, palladium, aluminum, nickel, and tin, as necessary.

The metal particles constituting the metal powder used in the present invention may have a spherical shape, a flake-like shape, a dendritic (branching tree-like) shape, a rod-like shape, or the like, for example. These shapes can be employed alone or in a combination of two or more.

The particle size when the metal particles have a spherical shape is preferably 0.03 μm or more, and more preferably 0.05 μm or more, in terms of the volume-based cumulative particle size $D_{SEM50}$ at a cumulative volume of 50 vol % as measured by analyzing an image observed under a scanning electron microscope. Also, the particle size is preferably 20 μm or less and more preferably 10 μm or less. If the particle size is within this range, a thin and uniformly thick coating film can be formed with high productivity, and the bonding strength between the bonding target members can be further increased.

The particle size when the copper particles have a flake-like shape is preferably 0.3 μm or more, more preferably 0.5 μm or more, and even more preferably 0.7 μm or more, in terms of the volume-based cumulative particle size $D_{50}$ at a cumulative volume of 50 vol % as measured through particle size distribution analysis using a laser diffraction and scattering method. Also, the particle size of the copper particles having a flake-like shape is preferably 100 μm or less, more preferably 70 μm or less, and even more preferably 50 μm or less, in terms of $D_{50}$. If particles with this particle size are contained, a coating film in which the particles are arranged without gaps therebetween can be formed, a bonding portion with a dense structure can be formed, and thus high bonding strength can be realized between the bonding target members. The flake-like shape refers to a shape having a pair of plate-like faces constituting main faces of a particle and a side face orthogonal to these plate-like face, and the plate-like faces and the side face may be each independently a flat face, a curved face, or an uneven face.

The reducing agent contained in the bonding composition is preferably solid at 1 atm and room temperature (25° C.). Such a reducing agent is used to facilitate sintering of metal particles through firing of the composition, thereby realizing high bonding strength. For this purpose, it is advantageous that the reducing agent has a chemical structure with at least one amino group and a plurality of hydroxyl groups. The wording "is solid at room temperature (25° C.)" means that the melting point of the solid reducing agent is higher than 25° C. Hereinafter, a solid-state reducing agent is also referred to as a "solid reducing agent".

It is preferable that the melting point of the solid reducing agent is lower than or equal to the sintering temperature of the metal powder. It is also preferable that the boiling point of the solid reducing agent is higher than the boiling point of a liquid medium, which will be described later. If a solid reducing agent having such material properties is used, the solid reducing agent can remain as solid in the bonding composition when the coating of the bonding composition is dried to obtain a dry coating film, as a result of which the shape retention of the dry coating film of the bonding composition can be improved.

From the viewpoint of efficiently realizing high bonding strength during the pressure bonding and from the viewpoint of realizing high electrical conduction reliability after the pressure bonding when conductors are used as the bonding target members, the solid reducing agent is preferably an amino alcohol compound represented by Chemical Formula (2) or (3) below.

(2)

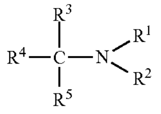

(3)

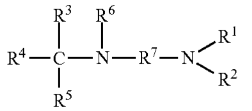

In Chemical Formula (2) or (3), $R^1$ to $R^6$ each independently represent a hydrogen atom, a hydroxyl group, a hydrocarbon group having 1 to 10 carbon atoms, or a hydrocarbon group having 1 to 10 carbon atoms and having a hydroxyl group. Furthermore, in Formula (3), $R^7$ represents a hydrocarbon group having 1 to 10 carbon atoms or a hydrocarbon group having 1 to 10 carbon atoms and having a hydroxyl group. The hydrocarbon group may be a saturated or unsaturated aliphatic group. This aliphatic group may be linear or branched.

Specific examples of the amino alcohol compound represented by Chemical Formula (2) or (3) include: bis(2-hydroxyethyl)iminotris(hydroxymethyl)methane (BIS-TRIS, melting point: 104° C., boiling point:above 300° C., corresponding to Chemical Formula (2)); 2-amino-2-(hydroxymethyl)-1,3-propanediol (TRIS, melting point: 169 to 173° C., boiling point:above 300° C., corresponding to Chemical Formula (2)); and 1,3-bis(tris(hydroxymethyl) methylamino)propane (BIS-TRIS propane, melting point: 164 to 165° C., boiling point:above 300° C., corresponding to Chemical Formula (3)). Of these compounds, bis(2-hydroxyethyl)iminotris(hydroxymethyl)methane is preferably used as the solid reducing agent, from the viewpoint of improving the sinterability of the metal particles and obtaining a bonded member that realizes high bonding strength.

The above-described solid reducing agents can be used alone or in a combination of two or more. In each case, the content ratio of the solid reducing agent in the bonding composition is preferably 0.1 parts by mass or more, and more preferably 1 part by mass or more, with respect to 100 parts by mass of the metal powder, from the viewpoint of improving the sinterability of the metal particles. Also, from the viewpoint of realizing favorable application performance to the bonding target members while maintaining the ratio of the metal powder in the bonding composition, the content ratio of the solid reducing agent is practically 10 parts by mass or less, preferably 8 parts by mass or less, and even more preferably 5 parts by mass or less.

From the viewpoint of improving the ease of application of the coating film, the bonding composition preferably further contains a liquid medium. From the viewpoint of improving all the ease of application of the bonding composition, the solubility of the solid reducing agent, and the formation efficiency of the dry coating film due to the moderate volatility of the liquid medium, the liquid medium is preferably a non-aqueous solvent, more preferably a monohydric or polyhydric alcohol, and even more preferably a polyhydric alcohol.

Examples of the polyhydric alcohol include propylene glycol, ethylene glycol, hexylene glycol, diethylene glycol, 1,3-butanediol, 1,4-butanediol, dipropylene glycol, tripropylene glycol, glycerol, Polyethylene glycol 200, and Polyethylene glycol 300. These liquid media can be used alone or in a combination of two or more.

In the case where the bonding composition contains a liquid medium, the liquid medium content is preferably from 10 to 40 parts by mass, and more preferably from 10 to 35 parts by mass, with respect to 100 parts by mass of the metal powder, from the viewpoint of improving the shape retention of the coating film when the bonding composition is applied to bonding target members and the uniformity of the thickness of a formed coating film.

As long as the effects of the present invention can be achieved, the bonding composition may also contain other components such as a binder component, a surface tension regulator, an antifoaming agent, and a viscosity modifier, for example. The total amount of the other components is preferably from 0.1 to 10 parts by mass with respect to 100 parts by mass of the metal powder.

A bonded member having such a bonding portion can be favorably used in environments exposed to high temperatures, for example, in an in-vehicle electronic circuit or an electronic circuit in which a power device is implemented, by taking advantage of its characteristics such as high bonding strength and heat conductivity.

EXAMPLES

Hereinafter, the present invention will be described in greater detail using examples. However, the scope of the present invention is not limited to the examples below. Unless otherwise specified, "%" and "parts" respectively mean "mass %" and "parts by mass".

Example 1

(1) Preparation of Bonding Composition

A mixture of a spherical copper powder with a $D_{SEM50}$ of 0.14 μm and a flake-like copper powder with a $D_{50}$ of 4.9 μm and an aspect ratio (the ratio of the length of a main face to the thickness of a particle) of 13 was used as the copper powder. The proportions of the spherical copper powder and the flake-like copper powder in the copper powder mixture were set such that spherical copper powder 70 mass %:flake-like copper powder 30 mass %.

Bis(2-hydroxyethyl)iminotris(hydroxymethyl)methane was used as the reducing agent, in a proportion of 2.5 parts with respect to with respect to 100 parts of the copper powder.

A mixture of Polyethylene glycol 300 (1 part with respect to 100 parts of the copper powder) and hexylene glycol (31.6 parts with respect to 100 parts of the copper powder) was used as the liquid medium.

The copper powder, the reducing agent, and the liquid medium were mixed to obtain a paste-like bonding composition.

The bonding composition had a viscosity of 34 Pa·s at a shear rate of 10 $s^{-1}$ and 25° C.

(2) Manufacture of Bonded Structure

The bonding composition was applied through screen printing to the center portion of a copper plate having a 20 mm square shape in plan view (with a thickness of 1 mm) serving as the second bonding target member, to form a coating film. The coating film was formed in a 6 mm square region including the center portion of the copper plate using a 100 μm thick metal mask. The coating film was dried in a hot-air dryer at 110° C. for 10 minutes to remove part of the liquid medium and then left to dry under room temperature to obtain a dry coating film. The content of the liquid medium in the dried coating film was checked and found to be 5 mass % or less.

Next, a semiconductor device having a 4.9 mm square shape in plan view and having a silver layer formed through Ag metallization over the entire surface (SiC chip, with a thickness of 0.38 mm, manufactured by Wolfspeed, CPW5-1200-Z050B) serving as the first bonding target member was placed on the dry coating film to obtain a stack. In this state, a pressure of 20 MPa was applied in the thickness direction, and the temperature was increased from 40° C. to 280° C. at a temperature increase rate of 960° C./min under a nitrogen atmosphere, followed by firing at 280° C. for 5 minutes to manufacture a bonded structure having the structure shown in FIGS. 1(*a*) and 1(*b*). In this bonded structure, each bonding target member and the bonding portion were formed adjacent to each other over the entire region in plan view. It was confirmed by mass spectrometry using TOF-SIMS that the chemical structure represented by Structure (1) above was formed in the bonding portion, which is the sintered body of the dry coating film.

Example 2

A bonded structure having the structure shown in FIGS. 1(*a*) and 1(*b*) was obtained in the same way as that in Example 1, except that the pressure applied during sintering was changed to 10 MPa in the manufacture of the bonded structure. It was confirmed by mass spectrometry using TOF-SIMS that the chemical structure represented by Structure (1) above was formed in the bonding portion.

Comparative Example 1

A bonded structure was obtained in the same way as that in Example 1, except that the pressure applied during sintering was changed to 6 MPa in the manufacture of the bonded structure. It was confirmed by mass spectrometry using TOF-SIMS that the chemical structure represented by Structure (1) above was formed in the bonding portion.

Measurement of Bonded Rate

The bonded rates Rc and Rs at the boundary planes between the bonding target members and the bonding portion and their ratio Rs/Rc of each of the bonded structures according to the examples and the comparative example were measured and calculated using the above-described methods using software MeasurementAdviser manufactured by System In Frontier Inc. Table 1 below shows the results together with the total length Lt in the measurement field of view.

For the sake of ease of description, the table below shows only the bonded rate between the SiC chip (the first bonding target member 11) and the bonding portion 15.

Evaluation of Bonding Reliability

The bonded structures were subjected to 10 cycles of the temperature cycle test (TCT), and the state of delamination from the sintered body was observed from the back side of the copper plate using the reflection method with a 75 MHz probe using an ultrasonic flaw detector (model number: FineSAT III manufactured by Hitachi Power Solutions Co., Ltd.). One TCT cycle was (1) −40° C. for 15 minutes and (2)+125° C. for 15 minutes.

When observing the delamination of the bonding layer, the gain value was set to a value between 25 and 35 dB, and the delay and width of the S-gate were adjusted such that the peak position of the S-gate was at the surface of the copper plate. The delay of the F-gate was adjusted to specify the observation range of the bonding layer, and the width was set to a peak width of 1.5 wavelengths. The Z-axis coordinate of the probe was adjusted to maximize the amplitude of the observation peak, and observation was performed. The contrast of the observed image was adjusted using the auto function.

With the equipment described above, regions with good bonding conditions were observed to be darker in color (black), while regions with cracks or delamination and poor bonding conditions were observed to be lighter in color (white). FIGS. 3 and 4 show image data before and after TCT for Example 1 and Comparative Example 1.

The obtained image data was binarized using image processing software Image-J, and the percentage of black area in the observed area (bonded percentage after 10 cycles of TCT; %) was calculated. That is to say, after starting Image-J, Analyze-Set measurement was selected, and Area, Area fraction, and Limit to Threshold were checked. Then, after selecting File-Open and opening the image data for calculating the bonded percentage, the range (A) of the SiC chip-mounted portion in the image was specified. Next, Edit-Copy to system was selected, the specified range (A) was copied, and then File-New-System clipboard was selected and the image of the specified range (A) was pasted. Then, to clarify the bonding portion, Image-Type-8 bit was selected, the image was converted, and Image-Adjust-Threshold was selected to adjust the image threshold to 110. Then, the red range (B) that existed within the range (A) of the SiC chip-mounted portion in the adjusted image was specified. The red range (B) is the SiC chip bonded portion, and the bonded percentage is calculated as (B)/(A)×100. A higher bonded percentage indicates higher bonding reliability even when excessive temperature changes occur. Table 1 shows the results.

TABLE 1

| | | | Ex. 1 | Ex. 2 | Com. Ex. 1 |
|---|---|---|---|---|---|
| | | Sintering temperature [° C.] | 280 | 280 | 280 |
| | | Sintering time [minutes] | 5 | 5 | 5 |
| | | Temperature increase rate [° C./min] | 960 | 960 | 960 |
| | | Pressure [MPa] | 20 | 10 | 6 |
| Bonded rate | Central region A1 | Total length in measurement field of view Lt [μm] | 30.127 | 30.184 | 29.98 |
| | | Bonded length L1 [μm] | 19.554 | 14.711 | 6.812 |
| | | Bonded rate Rc (L1/Lt) | 0.65 | 0.49 | 0.23 |
| | Peripheral region A2 | Total length in measurement field of view Lt [μm] | 30.044 | 29.993 | 29.974 |
| | | Bonded length L2 [μm] | 15.165 | 10.756 | 8.852 |
| | | Bonded rate Rs (L2/Lt) | 0.50 | 0.36 | 0.30 |
| | | Rs/Rc | 0.78 | 0.74 | 1.30 |
| Evaluation of bonding reliability | | Bonded percentage after TCT [%] | 97 | 97 | 20 |

INDUSTRIAL APPLICABILITY

The present invention provides a bonded structure with high bonding reliability.

The invention claimed is:

1. A bonded structure in which two bonding target members and a bonding portion formed between and adjacent to the bonding target members are bonded together, wherein the bonding portion comprises a sintered body of copper particles containing spherical copper particles and flake-like copper particles, a ratio (Rs/Rc) of a bonded rate Rs between the bonding target members and the bonding portion in a peripheral region of the bonded structure to a bonded rate Rc between the bonding target members and the bonding portion in a central region of the bonded structure is from 0.6 to 0.8, in a cross section of the bonded structure taken along a thickness direction thereof, the bonded rate Rc is 0.3 or more, and the bonded rate Rs is 0.35 or more and 0.55 or less, wherein a temperature increase rate during sintering is 120 to 2000° C./min.

2. The bonded structure according to claim 1, wherein a surface of at least one of the bonding target members contains at least one metal selected from gold, silver, copper, nickel, and titanium.

3. The bonded structure according to claim 1, wherein the bonding portion comprises a compound with a structure represented by Formula (1) below:

(1)

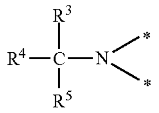

in Formula (1), $R^3$ to $R^5$ each independently represent a hydrogen atom, a hydroxyl group, a hydrocarbon group having 1 to 10 carbon atoms, or a hydrocarbon group having 1 to 10 carbon atoms and having a hydroxyl group, and

* represents a copper-binding site.

4. The bonded structure according to claim 1, wherein the copper particles are comprised of 70% of the spherical copper particles and 30% of the flake-like copper particles.

5. The bonded structure according to claim 1, wherein a particle size of the spherical copper particles lies in a range of 0.03 microns or more.

6. The bonded structure according to claim 1, wherein a particle size of the flake-like copper particles lies in a range of 0.3 microns or more.

7. The bonded structure according to claim 1, wherein the bonded rate Rc is 0.4 or more.

8. The bonded structure according to claim 1, wherein the bonded rate Rc is 0.5 or more.

9. The bonded structure according to claim 1, wherein the bonded rate Rs is 0.35 or more and 0.5 or less.

* * * * *